United States Patent [19]

Engdahl

[11] Patent Number: 4,802,660
[45] Date of Patent: Feb. 7, 1989

[54] ELECTRICALLY CONTROLLED SPRING ELEMENT

[75] Inventor: Göran Engdahl, Täby, Sweden

[73] Assignee: Asea Brown Boveri AB, Västerås, Sweden

[21] Appl. No.: 168,417

[22] Filed: Mar. 15, 1988

[30] Foreign Application Priority Data

Mar. 19, 1987 [SE] Sweden .............................. 8701138

[51] Int. Cl.$^4$ ................................................. F16F 6/00
[52] U.S. Cl. ...................................... 267/182; 310/26; 367/156
[58] Field of Search ........................ 148/100; 267/182; 310/26; 367/156, 168

[56] References Cited

U.S. PATENT DOCUMENTS

| | | | |
|---|---|---|---|
| 4,158,368 | 6/1979 | Clark | 137/489.5 |
| 4,308,474 | 12/1981 | Savage et al. | 310/26 |
| 4,378,258 | 3/1983 | Clark et al. | 148/100 |
| 4,438,509 | 3/1984 | Butler et al. | 367/156 |
| 4,642,802 | 2/1987 | Pozzo et al. | 367/168 |

FOREIGN PATENT DOCUMENTS 8603888  7/1986  PCT Int'l Appl.

OTHER PUBLICATIONS

"Giant Magnetostriction Gives More Sensitive Transducers" in *Elteknik Med Aktuell Elektronik*, 1984:16, p. 57.

*Primary Examiner*—Duane A. Reger
*Attorney, Agent, or Firm*—Watson, Cole, Grindle & Watson

[57] ABSTRACT

An electrically controlled spring element according to the invention comprises one or more basic spring elements and a mechanical transformer to increase the stretch of the spring element. The basic spring element comprises two mechanically connected elements with an intermediate transmission for power output, each of the elements consisting of a rod pre-magnetized by permanent magnets and consisting of highly magnetostrictive material (Terfenol), a surrounding excitation coil and an outer frame holding the parts together. The magnetic orientation of the pre-magnetization and the coils shall be such that, regardless of the direction of the control current, the electrically controlled excitation is always directed in the same direction as the pre-magnization in one element and is always directed in the opposite direction to the pre-magnetization in the other element.

3 Claims, 3 Drawing Sheets

ELECTRICALLY CONTROLLED SPRING ELEMENT

The present invention relates to an electrically controlled spring element which, besides being perfectly suitable for use as a passive spring, can be specially designed to give it extremely good frequency properties. This enables it to be used as basic element in equipment for vibration-free suspension of extremely sensitive instruments, for instance, vibration-free mechanical transmission, as active mechanical moderator or actuator, controllable inductance, electromechanical transformer, etc.

The main and essential difference between a passive, conventional spring element, and the electrically controllable spring element is that spring constant, spring force and stretch can all be controlled electrically. By applying stationary electrical control, the spring element can be caused within an extremely short time, in the region of 50 ms, to behave as a pre-stressed, mechanically passive spring element. Thanks to the good frequency properties for which the elements can be designed, it can also be altered in a very short time from one static, spring-force state to another and can thus also respond very well to dynamic electric control.

The fundamental principle for electrically controlled spring elements has long pertained to the state of the art. However, hitherto known applications are primarily mechanical actuators, such as sonar, and in connection with certain types of transducers. The unique properties which can be achieved are due to the active material in the spring element consisting of a magnetic core having very special properties, i.e. its physical form, E-module and relative permeability are altered when the material is subjected to varying degrees of magnetization and also when it is in various states of mechanical stress.

It has been known for some time that the so-called rare earth metals samarium (Sm), terbium (Tb), dysprosium (Dy), holmium (Ho), erbium (Er), and so on, have extremely high magnetostriction at very low temperatures. If an ordinary metal material, for instance, has a magnetostrictive linear expansion of about 10 $\mu$m/m, the rare earth metals have a linear expansion of up to 4400 $\mu$m/m at cryotemperature. Unfortunately, however, this pronounced magnetostrictive effect appears only at extremely low temperatures, thus greatly curtailing the list of possible applications.

It was discovered relatively soon, however, that extremely high magnetostriction in comparison with ordinary metals could also be obtained at room temperature, or even temperatures up to several hundred degrees, by alloying the rare earth metals with iron (Fe). Purely practically it is possible to obtain magnetostriction in the order of 2000 $\mu$m/m at room temperature. This in any case constitutes a linear expansion 150 times that of ordinary metalic substances. Elements made of alloys between ferro-metals and the rare earth metals can thus be utilized in many applications based on the magnetostrictive effect, which would previously have been impossible or which did not give sufficient effect to be economically profitable.

The properties of these alloys have been documented in articles such as "Giant magnetostriction gives more sensitive transducers" by L. Jansson, published in "El-teknik med aktuell elektronik" 1984:16, page 57, and in a multitude of patents, e.g. U.S. Pat. No. 4,308,474, Rare Earth-Iron Magnetostrictive Materials and Devices using these Materials. This publication states a plurality of different alloy compositions. However, it is intimated here, without any further description, that these materials can be used as magnetostrictive elements in magnetostrictive transducers, time-delaying elements, variable frequency oscillators and filters.

U.S. Pat. No. 4,378,258 shows a method of converting magnetic energy to mechanical energy, in which the mechanical energy is in the form of a change in the dimensions of a special alloy caused by a change in the magnetic field. These particular alloys have now been used in several practical applications, e.g. in the form of a SONAR, see U.S. Pat. No. 4,438,509, and in valves, see U.S. Pat. No. 4,158,368.

The rare earth metals are generally expensive. Furthermore, the production of materials containing these alloys entails relatively complicated processes. Intensive research has therefore been carried on to develop alloys with optimal data both from the cost and the manufacturing aspects. The best composition so far consists of $Tb_{0.27}Dy_{0.73}Fe_{1.9}$, and the alloy has been called TERFENOL-D. The material is currently manufactured in a limited number of places in the world and is supplied in the form of cylindrical rods having a diameter of 6–about 40 mm and a length up to about 300 mm.

A device according to the invention will be described with the aid of graphs showing the technical capabilities of the material and figures giving examples of how an electrically controlled spring element according to the invention may be constructed.

Figure 1:
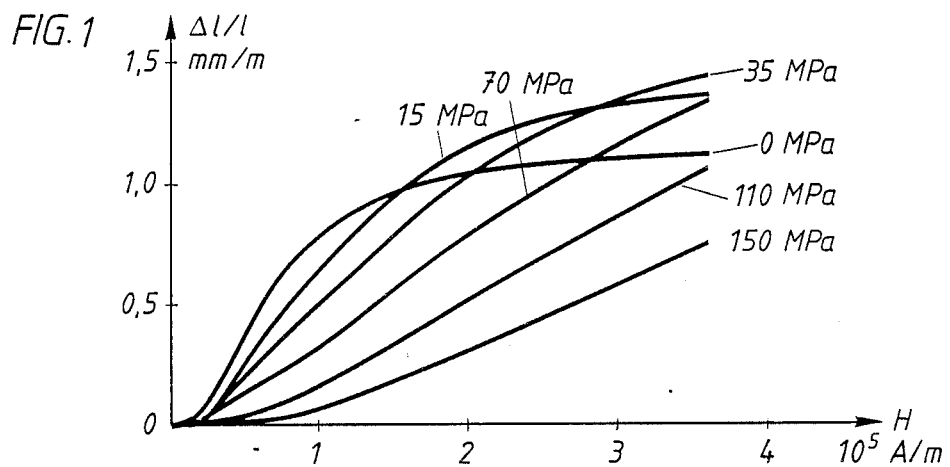
FIG. 1 shows the ratio between a magnetizing H-field applied axially on a TERFENOL rod, hereinafter called T-rod, and the relative linear expansion when the T-rod is subjected to various mechanical stress conditions.

In FIG. 1 the relative linear expansion $\Delta l/l$ (mm/m) is shown for a T-rod which is subjected to a magnetizing H-field (A/m) along the symmetry axis of the rod. The graph scale shows how the linear expansion is dependent on the mechanical stress condition (MPa) to which the T-rod is subjected.

Figure 2:
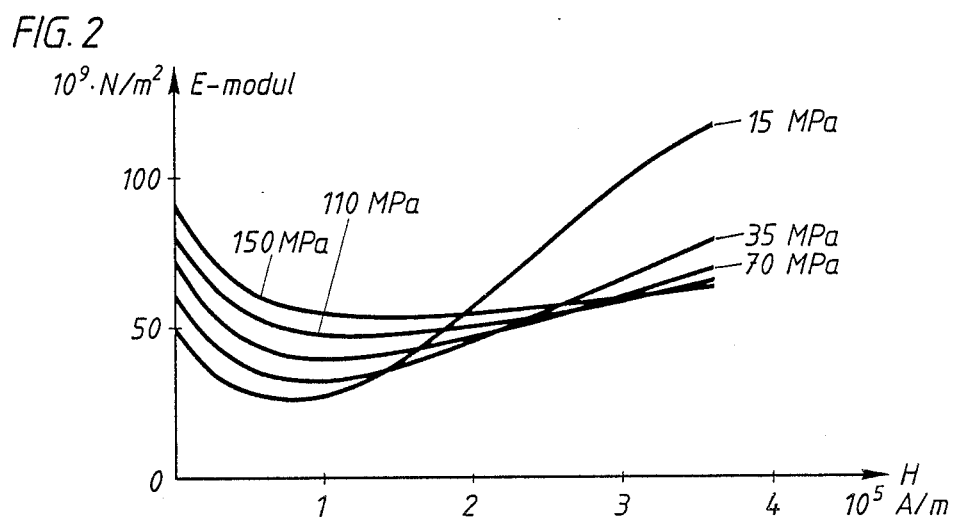
FIG. 2 shows how the E-module of the material varies dependent on the same parameters.

In FIG. 2 the equivalent ratio is shown between magnetizing H-field and the E-module ($N/m^2$) of the material at various mechanical stress conditions.

Figure 3:
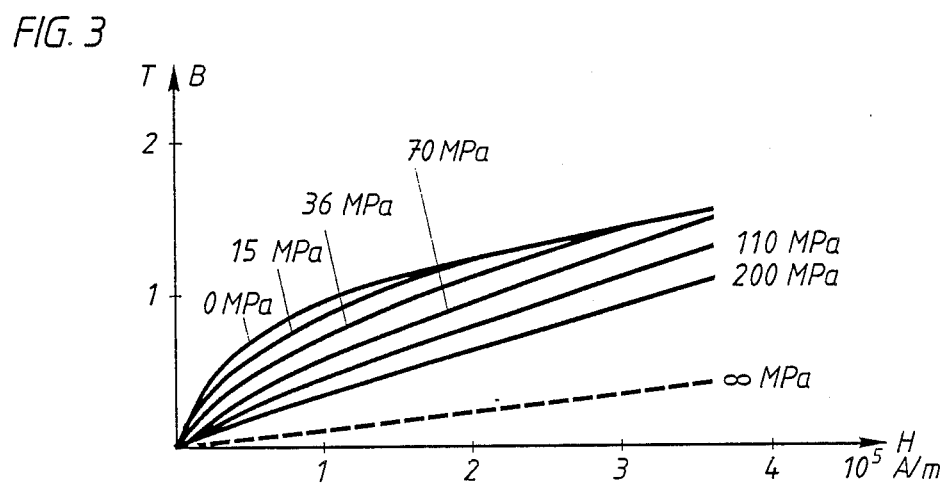
FIG. 3 shows the ratio between H-field and B-field for various mechanical stress conditions.

In FIG. 3 the ratio is shown between a magnetizing H-field and the corresponding B-field (tesla) for various mechanical stress conditions. Of the properties to which T-rods give rise, that of its great alteration in length, compared with known magentic materials, is the one which has been utilized most. This is particularly evident from patent specifications such as U.S. Pat. No. 4,438,509 "Transducer with Tensioned-Wire Precompression", GB No. 2 174 863 A "Permanent magnet biased magnetostrictive transducer", WO No. 85/02084 "Low Frequency Sound Transducer" and WO No. 86/03888 "A Rare Earth Flextensional Transducer". The alteration in length of the T-rod is used here to cause some type of membrane to oscillate in time with the magnetization.

In an electrically controlled spring element according to the invention it is the mechanical properties which are utilized more in isolation, but of course intimately associated with the linear alterations in the T-rod. Although relatively modest, the alteration in length which can be obtained at various magnetization conditions of the highly magnetostrictive materials means that the stretch range, which may be up to about 100 $\mu$m, will in many applications be insufficient in a spring element based solely on the linear expansion of a T-rod.

A spring element according to the invention therefore also includes a mechanical transmission between the highly magnetostrictive material and the mechanical load, in the form of a mechanical transformer permitting a considerably increased stretch range.

As will be seen in FIG. 1, the magnetostriction is dependent on the magnetizing field H. If the magnetization in a quasi-stationary state is to be proportional to an applied time-varying magnetization, therefore, the T-rod must be pre-magnetized, preferably by means of permanent magnets. According to a known method, e.g. described in WO No. 86/03888, this can be achieved by dividing the T-rod in axial direction into a number of pellets between which the permanent magnets are placed, in order to ensure that the magnetization is distributed as uniformly as possible.

In order to obtain the best possible dynamic properties various forms of lamination may be advisable, such as dividing the T-rod axially into a number of straight lamina of substantially equal width, by slicing the T-rod as shown in WO No. 86/03888, or by producing a spiral air gap by means of spark treating.

In the case of large dynamic loads on a spring element based on T-rods, a correspondingly large dynamic magnetizing H-field is also required. The excitation coil surrounding the T-rod shall be able to generate this. The dynamic magnetization can be effected in conventional manner by increasing the supply voltage at increasing frequency. Another method might be for the coil to consist of a number of coaxial, concentric coils supplied via galvanically separated, frequency-selecting amplifiers in such a way that the innermost coil is supplied by high- frequency components and the outermost coil is connected to an amplifier step with low frequency components.

To obtain an optimum operating point with a given pre-magnetization of a T-rod forming part of an electrically controlled spring element, there must also be equivalent mechanical pre-stressing. Such mechanical pre-stressing can be achieved in many ways. An example is shown in U.S. Pat. No. 4,438,509 already mentioned, where the T-rod is used in a SONAR application. The T-rod is here secured between two yokes and the mechanical pre-stressing in the rod is achieved by tensioning wires pulling the yokes together. Of course just helical extension springs may also be used.

Unfortunately, the tensile strength of a T-rod is considerably lower than its compressive strength. Mechanical pre-stressing is thus also necessary for T-rods under strong mechanical and electrical loads, to prevent them being subjected to tensile stress. The mechanical pre-stressing required to prevent the occurrence of tensile stress in the T-rod is, in transient excitation and considerable mechanical load, considerably greater than the pre-stressing motivated taking into consideration only the selection of optimum operating point.

The above belongs substantially to the state of the art concerning the use of T-rods in various types of actuators and transducers. To obtain a technically acceptable electrically controlled spring element according to the invention it is advisable, and sometimes necessary depending on the application, to provide the element with one or more of the technical partial solutions described.

The basis of an electrically controlled spring element according to the invention is an element, known per se, comprising a rod of highly magnetostrictive material, pre-magnetized by permanent magnets, and a surrounding excitation coil.

Figure 4:
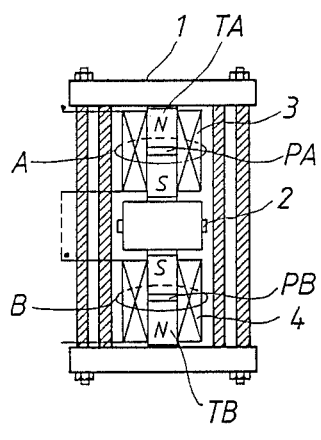
FIG. 4 shows an electrically controlled basic spring element according to the invention and how mechanical pre-stressing can be achieved in such an element.

Characteristic of the invention is that two such elements A and B according to FIG. 4 form an electrically controlled basic spring element (AB). The elements are mounted in a frame 1, the rods TA and TB having the same centre line and with an intermediate transmission element having a power output 2. Pre-magnetization is suitably effected by dividing the T-rods into pellets with permanent magnets inserted between them, indicated symbolically in FIG. 4 as PA and PB. The excitation coils are designated 3 and 4. The magnetization circuits for the two elements should be so spaced that they do not noticeably influence each other. Contrary to the mechanical pre-stressing methods described, pre-stressing according to the invention is effected by mechanically counter-connecting the two elements comprising the basic spring element. This can be achieved by ensuring that the magnetic orientation of the pre-magnetization and the excitation coils are always directed in a certain manner, i.e. the external electrically controlled magnetization must always be directed in the same direction as the pre-magnetization in one element and always directed in opposite direction to the pre-magnetization in the other element. Thus, regardless of the direction of the excitation current in the coils, one of the elements will always, and alternating with the current direction, be more compressively pre-stressed than the other element. Thus no pre-stressing in the proper mechanical sense will be necessary. The least compressively pre-stressed element will thus constitute pre-stressing for the most compressively pre-stressed element. The difference in spring force between the two elements constitutes the force supplied to the load.

An example of the coordination between the pre-magnetization directions and the direction of the electrical excitation required to achieve this form of "mechanical" pre-stressing can be seen in FIG. 4. If the coils are connected in order to magnetically act in the same direction, the winding direction marked by points (.), the pre-magnitization in the two elements A and B shall be directed in opposite directions, e.g. with both S poles or both N poles facing each other. Thus, regardless of the direction of the excitation current, one of the elements will be more compressively pre-stressed than the other.

If magnetization is harmonious and the coils are otherwise identical, they may suitably be connected in series. In the case of broad-band magnetization the elements may be supplied from different sources, mutually synchronized. Control is increased by this arrangement both because the resonance frequency of the system can be controlled and because no unnecessary energy is utilized to stress springs, as is the case in the state of the art when passive springs are used in strong transient magnetization. As explained, this is because the material must be protected against tensile stress by considerably overdimensioned, mechanical pre-stressing. Furthermore, if passive springs are used for pre-stressing, they will also serve as pull-off springs for the previously mentioned simple spring elements, as e.g. sonars, etc.

Figure 5:
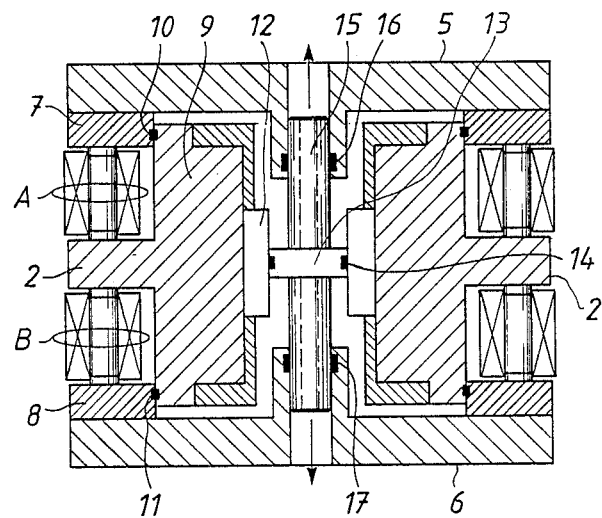
FIG. 5 shows a preferred embodiment of a complete spring element, including a mechanical transformer to increase the magnetostrictive movement.

As mentioned, an electrically controlled spring element according to the invention includes a mechanical transformer composed in principle as a differential plunger arrangement in order to increase the stretch range further than is permitted by the T-rod. This transformer and two electrically controlled basic spring elements AB mechanically counter-connected as shown in FIG. 4 constitute a preferred embodiment of a complete, electrically controlled spring element according to the invention and will be described with reference to FIG. 5. The complete spring element consists of a body with a central symmetry plane as shown in FIG. 5. In a preferred embodiment the body is cylindrical, with central cylindrical openings in the end surfaces for power outputs. The construction consists of an upper lid 5, a lower lid 6 and two rings 7 and 8 abutting the inner side of the upper and lower lids, respectively. The rings may also constitute an integrated part of each lid. The construction is made up of two basic spring elements according to FIG. 4. Each of these is located between the lids and on opposite sides and equidistant from the axial mid-line of the symmetry plane. Lids, rids and basic spring elements are held together by a screw arrangement, not shown. Inside the construction is a first plunger 9 having two diametrically located power outputs 2, located centrally and facing out on the plunger, corresponding to the power outputs on the basic spring element according to FIG. 4. This first plunger thus moves synchronously with the upward and downward movement of the T-rods which, as mentioned above, in practice move maximally 50–100 μm. The upward and downward movement of this plunger is controlled by the inner surface of the rings 7 and 8 and a seal is located in grooves in plunger and rings in the form of low-friction seals 10 and 11, permitting the upward and downward movement of the plunger.

This first plunger has a central, cylindrical through-opening with lining 12, inside which a second plunger 13 can move. The second plunger is sealed by a piston ring 14 to the lining of the first plunger. A tapped pin 15 runs centrally through the second plunger and is guided by said central openings in the lids 5 and 6. Seals in the form of piston rings 16 and 17 are also provided between each lid and the central pin. The free, sealing space formed between the top of the first plunger and the lid 5, between its inner surface with lining and central pin and the top of the second plunger is filled with a low-compressive medium having low internal friction, e.g. silicon oil, under a certain over-pressure. The corresponding space in the lower half of the complete spring element is also filled with the same medium under the same over-pressure.

When the basic spring element is influenced electrically the second plunger with its central pin will move in the opposite direction to the first plunger with an amplitude/stretch gain corresponding to the ratio between the active hydraulic areas of the two plungers. From the purely practical point of view there is no particular problem in achieving an active area ratio of 200 which, with a maximum movement of about 100 μm for the first plunger, would give a movement of 20 mm for the second plunger including its central pin. According to the energy principle, therefore, the available force on the central pin will be a corresponding number of times lower than the force on the shoulders 2.

An extremely simple way of influencing the stretch increase or the tensile or compressive force is to alter the ratio between the active areas of the plungers. This can be done, for instance, by altering the inner diameter of the lining ring and thus the outer diameter of the second plunger.

To allow increased power output with otherwise identical design and stretch, the number of pairs of mechanically connected electrically controlled basic spring elements according to FIG. 4 may be increased. In order to avoid uneven loading, however, the basic spring elements must be located in a symmetrical or mirror-symmetrical configuration.

Of course, the shape need not necessarily be cylindrical. The lids, and thus the outer contours, may be elliptical, rectangular, quadratic or some other shape depending on the application.

Figure 6:
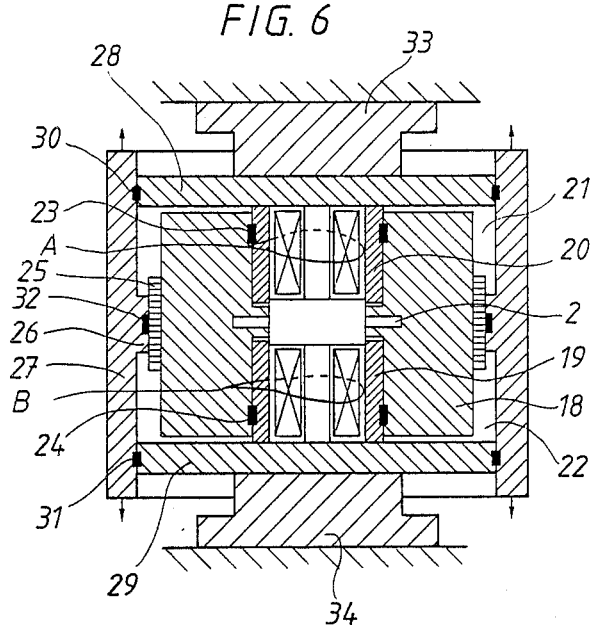
FIG. 6 shows an alternative embodiment of a complete spring element.

An electrically controlled spring element having only one basic spring element AB according to FIG. 4 is also possible. An embodiment with substantially the same principle for the mechanical transformer is shown in FIG. 6. The basic spring element AB is located centrally. The power outputs 2 are in engagement with a plunger 18 surrounding the basic spring element and controlled by two sleeves 19 and 20. The plunger is sealed from the outer spaces 21 and 22, filled with low-compressive medium, by means of low-friction seals 23 and 24. The piston 18 is provided with an outer lining ring 25 against which an outer plunger 26 can move. This plunger constitutes an integrated part of an outer, tubular casing 27 from which power output occurs from the electrically controlled spring element. The tubular casing is guided by the two lids 28 and 29. The two spaces 21 and 22 filled with low-compressive medium are provided with seals 30 and 31 between the casing and respective lids, and a seal 32 between the spaces 21 and 22. Other external positioning means are supports 33 and 34. As in the embodiment according to FIG. 5, the plungers 18 and 26 move in opposite directions and the amplitude/stretch gain is dependent on the ratio between the hydraulic areas of the plungers.

For all the embodiments described, and similar embodiments covered by the invention, it can be established that for the complete spring element all internal forces are compressive forces, that they can emit both compressive and tensile forces and that a relatively small quantity of hydraulic fluid is required.

Obviously, from the design point of view, the embodiments described and mentioned can be combined in modular manner in various ways as far as the actual basic element and the mechanical transformer are concerned.

Figure 7:
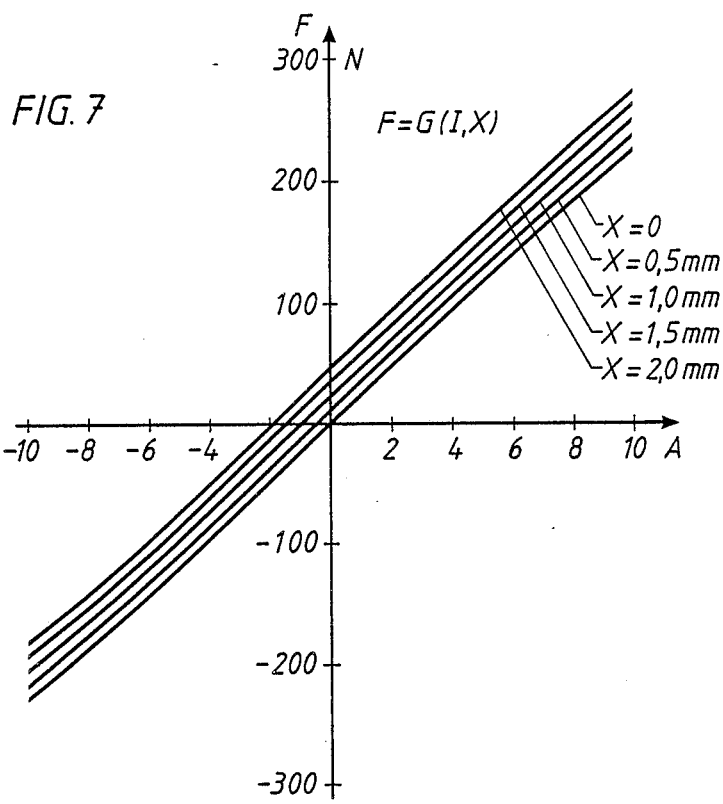
FIGS. 7 and 8 show various control characteristics for an electrically controlled basic element.
Figure 8:
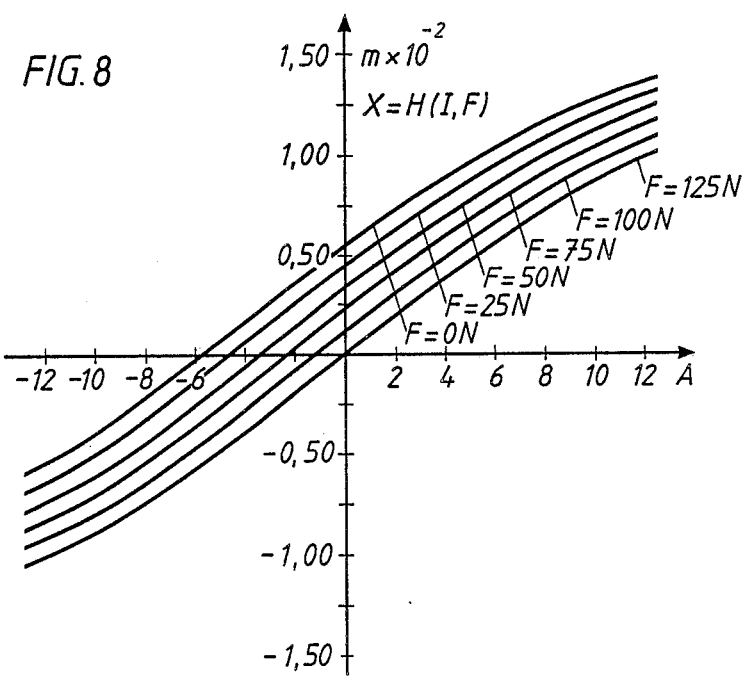

The control obtainable with the electrically controlled basic spring element, and thus also for a complete electrically controlled spring element such as that shown in FIG. 5 is evident from the characteristics shown in FIGS. 7 and 8. As can be seen, the scales are indicated only in standard values since the values for a specific design depend on the desired force or stretch for the application in question. The excitation current is a suitable control parameter.

I claim:

1. An electrically controlled spring element comprising an even number of elements in which each element consists of a rod of highly magnetostrictive material, permanent magnets to pre-magnetize the rod and a surrounding excitation coil and that the elements form a basic spring element comprising two elements mounted in a frame, the rods being in line, having the same centre line and with an intermediate transmission element having a power output, and that the magnetic orientation of the pre-magnetization and the excitation coils are so arranged that, regardless of the direction of the control current, they are directed in the same direction in one element and in opposite directions in the other element and that the electrically controlled spring element consists of one or more basic spring elements.

2. An electrically controlled spring element as claimed in claim 1 comprising two basic spring elements and a mechanical transformer, its symmetry plane with the two basic spring elements being equidistant from the axial centre line of the symmetry plane, and the mechanical transformer consisting of an upper lid and a lower lid with central openings, rings abutting the lids, a first plunger, sealed against the rings with the power output of the basic spring elements arranged as an external, integrated part, a second plunger arranged inside the first plunger and having a tapped central pin guided and sealed against the central openings of the lids, for power output from the electrically controlled spring element, and the space between the upper lid and the upper part of the first plunger and the upper side of the second plunger and the space between the lower lid and the lower part of the first plunger and the lower side of the second plunger, respectively, being filled with a low-compressive medium under overpressure.

3. An electrically controlled spring element as claimed in claim 1 comprising one basic spring element and a mechanical transformer which consists of an upper lid and a lower lid, a first plunger surrounding and sealed against the basic spring element and arranged in engagement with the power output of the basic spring element, and a second, outer plunger surrounding and sealed against the first plunger, arranged as an integrated part of an outer, tubular casing for power output from the electrically controlled spring element, said casing being arranged to be guided by the lids, and that the space between the upper lid, the upper part of the first plunger and the casing and the upper side of the second plunger and the space between the lower lid, the lower part of the first plunger and the casing and the lower side of the second plunger, respectively, are filled with a low-compression medium under overpressure.

* * * * *